United States Patent
Olson

[11] Patent Number: 5,818,695
[45] Date of Patent: Oct. 6, 1998

[54] HEAT SINK AND SPRING CLIP ASSEMBLY

[75] Inventor: Robert Norman Olson, Mountain View, Calif.

[73] Assignee: Apple Computer, Inc., Cupertino, Calif.

[21] Appl. No.: 804,992

[22] Filed: Feb. 25, 1997

[51] Int. Cl.⁶ .................................................. H05K 7/20
[52] U.S. Cl. ........................ 361/719; 174/16.3; 257/727
[58] Field of Search ............................. 24/457, 458, 295, 24/297, 625, 570, 523.1; 411/352, 516, 522; 174/16.3; 165/80.3, 185; 257/706, 707, 718, 719, 722, 727; 267/150, 158, 160; 248/316.7, 229.16; 361/687, 703, 704, 722, 717–719

[56] References Cited

U.S. PATENT DOCUMENTS

| | | | |
|---|---|---|---|
| 5,019,940 | 5/1991 | Clemens | 361/386 |
| 5,208,731 | 5/1993 | Blomquist | 361/704 |
| 5,329,426 | 7/1994 | Villani | 361/719 |
| 5,381,305 | 1/1995 | Harmon et al. | 361/704 |
| 5,504,652 | 4/1996 | Foster et al. | 361/704 |
| 5,541,811 | 7/1996 | Henningsson | 361/704 |
| 5,570,271 | 10/1996 | Lavochkin | 361/704 |
| 5,586,005 | 12/1996 | Cipolla | 361/719 |
| 5,699,229 | 12/1997 | Brownell | 361/719 |

*Primary Examiner*—Gerald P. Tolin
*Attorney, Agent, or Firm*—Mark A. Aaker

[57] ABSTRACT

A heat sink and spring clip assembly for removing heat from an electronic module and for holding the heat sink and electronic module to a circuit board, with the heat sink having a finned top surface, and a flat bottom surface larger than the electronic module for holding the electronic module between the bottom surface and the circuit board, with the bottom surface also having a downward extending leg at each corner, each leg ending with a foot for resting on the circuit board and holding the heat sink a fixed distance above the circuit board, and the spring clip for holding the heat sink to the circuit board having a substantially rectangular frame with two opposing torsion bar sides and two opposing leaf spring sides, the sides connected at four corners, and each corner having a downward extending leg with a latching notch for latching into a latching hole in the circuit board when the spring clip is pressed down over the heat sink and the leaf spring sides are compressed.

4 Claims, 3 Drawing Sheets

HEAT SINK AND SPRING CLIP ASSEMBLY

FIELD OF THE INVENTION

This invention relates to a heat sink and spring clip assembly for removing heat from an electronic module and for holding the heat sink and electronic module to a circuit board.

BACKGROUND OF THE INVENTION

As electronic modules such as microprocessors contain more circuitry and operate at faster speeds, they generate greater amounts of heat, which must be removed for reliable operation. Recent advances in the commercial use of exposed silicon die chips have allowed a more direct path for the transfer of the heat generated by the integrated circuitry, yet have now exposed the brittle silicon to an external environment. A traditional solution to remove heat from electronic modules is the use of a heat sink, which is heat conductive mass such as aluminum, which is held in intimate contact with the electronic module to absorb and dissipate the heat. The heat sink usually has a flat surface for physical contact to the electronic module, and a finned surface for dissipation of the heat into the neighboring air. The heat sink is usually held to the electronic module via screws, clamps, clips, adhesives, or some other mechanical fasteners.

The problem with the current fastening methods is that they provide too little control over the force applied by the heat sink to the electronic module. For example, the use of screws can provide too much force which can crack the electronic module. The newer exposed die modules also have no features with which a heat sink may be physically attached to due to their brittle nature. The use of clips and flat heat sinks can provide too little or too much force dependent on the compliance of the entire system, which can reduce thermal conduction, lead to damage of the electronic module during assembly, and may result in impact loads causing the electronic module to become damaged when the assembly comes under shock or vibration.

What is desired is a means of easily providing a controlled amount of force between a heat sink and an electronic module, that can be easily manufactured and assembled, and that maintains contact during shock or vibration, all without damaging the electronic module.

SUMMARY OF THE INVENTION

This invention provides a heat sink and spring clip assembly for removing heat from an electronic module and for holding and aligning the heat sink and clip to a circuit board which has an electronic module attached to it.

The heat sink has a finned top surface, and a flat bottom surface larger than the electronic module for sandwiching the electronic module between the bottom surface of the heat sink and the top surface of the circuit board. The heat sink's bottom surface has a downward extending leg at each corner, each leg ending with a foot for resting on the circuit board and holding the heat sink a fixed distance above the circuit board. When the spring clip is not engaged, each foot rests a small gap distance above the circuit board. The height of these legs is defined by the height of the electronic module minus the manufacturing tolerances of both the electronic module and the legs, thus assuring that the heat sink without the clip installed, when sitting atop the electronic module will have it's feet suspended above the circuit board by the small gap distance.

Additionally two of the four legs, diagonally opposed, have toes which extend further downward and which mate into holes in the circuit board. These two extended legs provide alignment of the heat sink for assembly, and limit the movement of the heat sink in the horizontal plane of the circuit board, thereby protecting the assembly from shock and vibration loading in the horizontal plane.

The spring clip for holding the heat sink to the circuit board has a substantially rectangular frame with two opposing torsion bar sides and two opposing leaf spring sides. The sides are connected at the four corners, and each corner has a downward extending leg with a latching notch for latching into a latching hole in the circuit board when the spring clip is pressed down over the heat sink and the leaf spring sides are compressed.

The simultaneous deflection of the spring clip and circuit board closes the small gap distance between the heat sink feet and the circuit board, thus pulling the feet against the circuit board and providing a controlled amount of force between the heat sink and the electronic module. This force is based on the deflection and load relationships defined by the physical geometry of the spring clip and the circuit board, and the materials and strength properties of the spring clip and circuit board.

The spring will exert more force than is required to close the gap. This additional vertical force keeps the heat sink feet from separating from the circuit board during shock loads and vibration loads. Due to the close proximity of the latching holes in the circuit board to the feet the additional load is transmitted directly to the feet with no perceptible loss of intentional compression loading between the top of the electronic module and the heat sink thermal contact zone.

Any additional loads applied to the heat sink by shock due to transportation or handling are transmitted by the feet to the circuit board and its supporting structure rather than to the electronic module thereby protecting the electronic module from immediate failure or from over stressing which could shorten the component's effective life.

The heat sink and spring clip are each a single piece which can be easily manufactured. The heat sink and spring clip can be easily assembled without special tools as the spring clip is pressed into place over the heat sink until latched. The resilient force of the spring clip and circuit board maintain contact between the heat sink and electronic module even during shock or vibration. These and other aspects of the invention will be apparent to a person skilled in the field from a review of the following drawings, description and claims.

DETAILED DESCRIPTION

Figure 1:
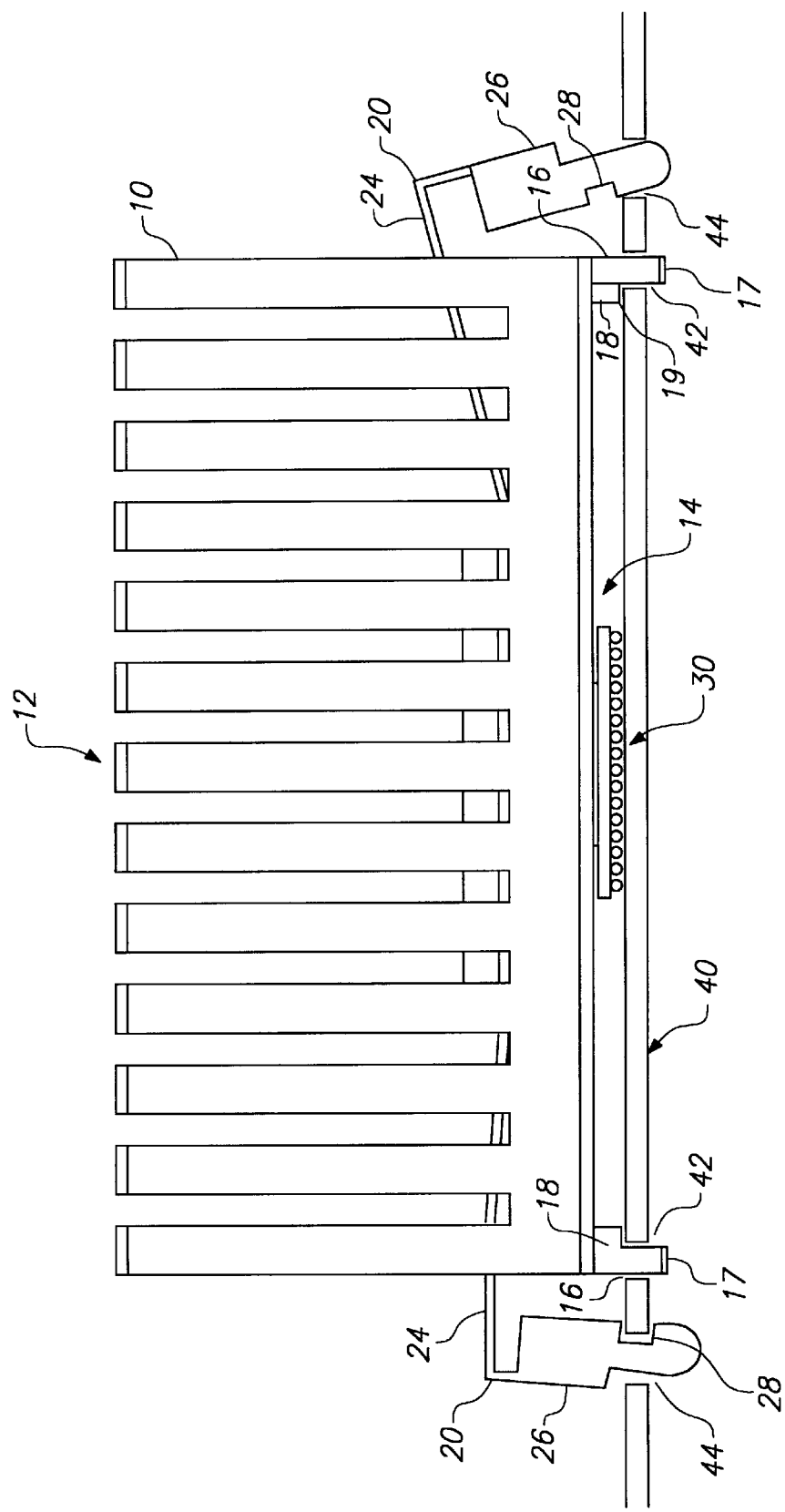
FIG. 1 illustrates a heat sink and spring clip assembly in accordance with this invention located in place over an electronic module on a circuit board.

This invention provides a heat sink and spring clip assembly for removing heat from an electronic module and for holding the heat sink and to an electronic module which has been assembled to a circuit board either by soldering or some mechanical means. FIG. 1 illustrates a heat sink and spring clip assembly in accordance with this invention located in place over an electronic module on a circuit board. The heat sink 10 is held by a spring clip 20 in place over an electronic module 30 on a circuit board 40. The spring clip is shown without compression on the right side of FIG. 1, and the spring clip is shown compressed and latched in place on the left side of FIG. 1.

The heat sink 10 has a finned top surface 12 for dissipating heat into the adjacent air. The heat sink 10 has a substantially flat bottom surface 14 larger than the electronic module 30 for thermal contact to the electronic module 30 and for sandwiching the electronic module 30 between the bottom surface 14 and the circuit board 40. The heat sink bottom surface 14 also has a downward extending leg 16 at each corner with a foot 18 which rests a small, pre-defined gap 19 distance above the circuit board 40 when the spring clip 20 is not yet compressed and latched into the circuit board 40. The gap 19 is closed and the foot rests against the circuit board 40 when the spring clip 20 is compressed and latched into place. In a preferred embodiment, two opposing legs 16 of the heat sink 10 also have a smaller diameter toe 17 extending downward beyond the foot 18, for extending through index holes 42 on the circuit board 40, thereby properly orienting the heat sink 10 in position on the circuit board 40.

The spring clip 20 for holding the heat sink 10 to the circuit board 40 has a substantially rectangular frame with two opposing torsion bar sides 22 (not seen in FIG. 1) and two opposing leaf spring sides 24, the sides connected at four corners, and each corner having a downward extending leg 26 with a latching notch 28 for latching into a latching hole 44 in the circuit board 40 when the spring clip 20 is pressed down over the heat sink 10 and the leaf spring sides 24 are compressed. Each downward extending leg 26 also has a radius or lead in to ramp the lead edge of the downward extending leg 26 over the inward edge of the latching hole 44 in the circuit board . The ramp distance being substantially equal to or slightly greater than the latching notch 28 depth.

Figure 2:
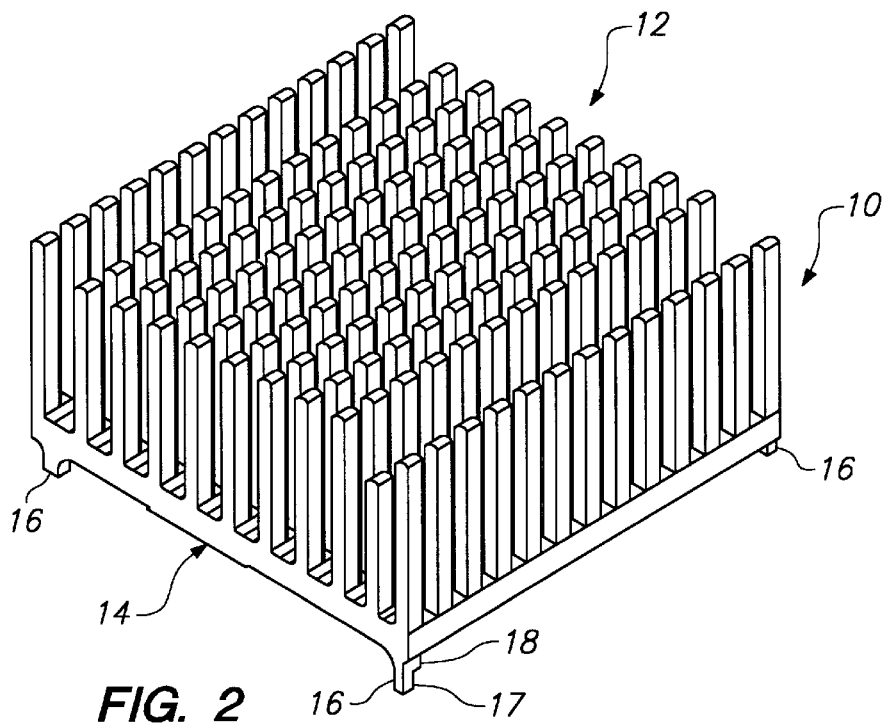
FIG. 2 provides a perspective view of a heat sink for use in accordance with this invention.

FIG. 2 provides a perspective view of a heat sink for use in accordance with this invention. The heat sink 10 has a finned top surface 12 and a flat bottom surface 14. Each corner has a downwardly extending leg 16 with a foot 18 for holding the heat sink 10 a fixed distance above the circuit board 10. In a preferred embodiment, two opposing legs of the legs 16 of the heat sink 10 also have a smaller diameter toe 17 extending downward beyond the foot 18, for extending through an index hole 42 on the circuit board 40, thereby properly orienting the heat sink 10 in position on the circuit board 40.

Figure 3:
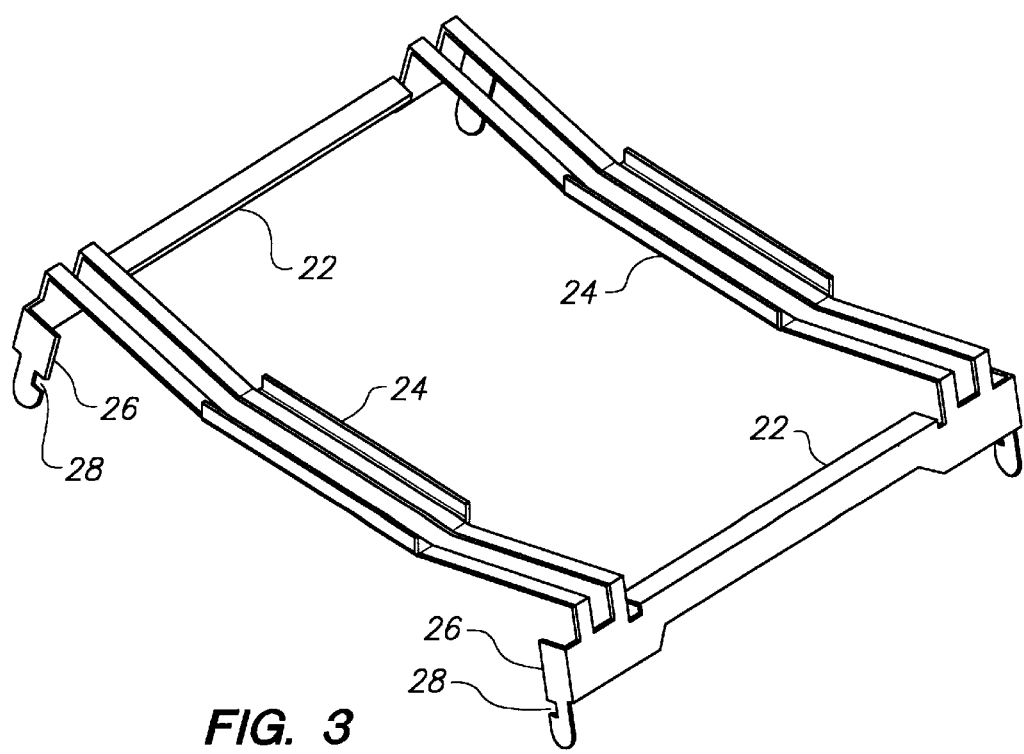
FIG. 3 illustrates details of the spring clip for use in accordance with this invention.

FIG. 3 illustrates details of the spring clip for use in accordance with this invention. The spring clip 20 has a substantially rectangular frame with two opposing torsion bar sides 22 and two opposing leaf spring sides 24. The sides are connected at the four corners, and each corner has a downward extending leg 26 with a latching notch 28 for latching into a latching hole 44 in the circuit board 40. The two opposing torsion bar sides 22 are slightly narrower than the width dimension of the heat sink 10, so that the two opposing leaf spring sides 24 will cross within the outline of the heat sink 10, preferably falling in between two rows of fins of the finned top surface 12. The two opposing leaf spring sides 24 are slightly longer than the length dimension of the heat sink 10, so that the legs 26 will protrude just outside the heat sink 10 when the spring clip 20 is placed over the heat sink 10. In a preferred embodiment, each of the leaf spring sides 24 consists of a pair of arms.

Figure 4:
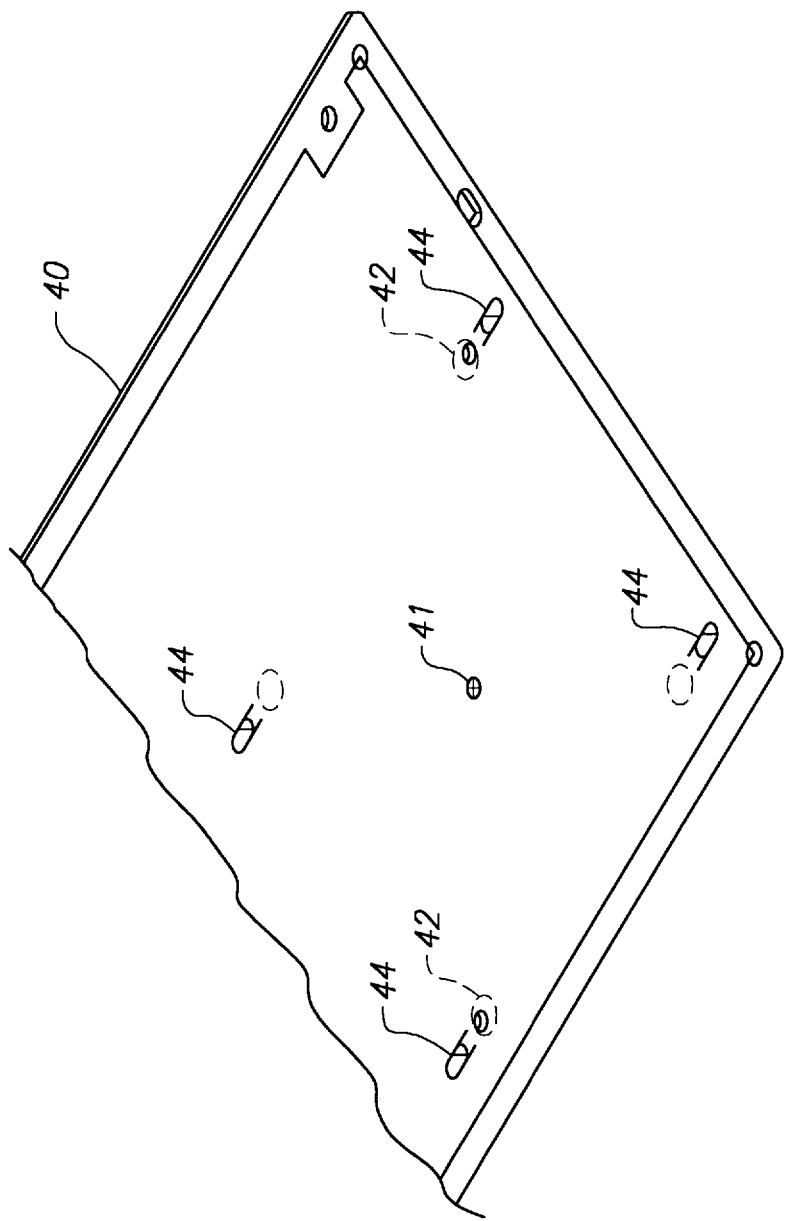
FIG. 4 illustrates details of the circuit board for use in accordance with this invention.

FIG. 4 illustrates details of the circuit board for use in accordance with this invention. The circuit board 40 has a central area 41 for mounting the electronic module 30, which will be covered by the heat sink 10 and spring clip 20 assembly. At each corner of the area covered by the heat sink 10 and spring clip 20 assembly, is the area upon which the foot 18 of the heat sink leg 16 will rest, and in a preferred embodiment, at each of two opposing corners will be an index hole 42 for receiving a smaller diameter toe 17 extending downward beyond the foot 18 of the heat sink leg 16. Further out at each corner of the area covered by the heat sink 10 and spring clip 20 assembly, is a latching hole 44 for receiving a latching notch 28 of each downward extending leg 26 of the spring clip 20. The latching hole 44 is preferably a slot to allow a sideways locking movement of the latching notch 28 onto the thickness of the circuit board 40.

In use, the electronic module 30 is mounted to the circuit board 40, and the heat sink 10 is placed over the electronic module 30. The spring clip 20 is placed over the heat sink 10 and pressed down onto the heat sink 10 so that the leaf spring sides 24 and circuit board 40 will resiliently compress until the heat sink 10 is stopped at the fixed distance above the circuit board 40 by the foot 18 of each heat sink leg 16 coming to rest on the circuit board 40. The spring clip's leaf spring sides 24 will continue to compress until the latching notches 28 are latched into the latching holes 44 in the circuit board, thereby holding the spring clip 20, heat sink 10 and electronic module 30 to the circuit board 40.

With this heat sink and spring clip assembly, a controlled amount of force is provided between the heat sink and electronic module, controlled by the resiliency of the spring clip leaf spring sides and resiliency of the circuit board. Too much force is prevented by the fixed distance provided as the foot of a heat sink leg rests on the circuit board. Once the foot is in contact with the circuit board, force between the heat sink and electronic module is limited. Too little force is prevented by the need to fully compress the leaf spring sides of the spring clip until the latching notches are latched within the latching holes in the circuit board. Even under shock and vibration, the maximum and minimum forces between the heat sink and electronic module are limited in a range which prevents breakage of the module and provides good thermal contact. The heat sink and spring clip are easily manufactured, and can be easily assembled with a simple operation of compressing the spring clip.

The torsion bars present an opposing force should anything attempt to dislodge any singular latch from its mating feature in the circuit board. This aids in maintaining an intact assembly during subassembly, handling such as is required to place the final circuit board assembly into a shipping container, and final installation into the total electronic system.

Other variations will be apparent to one skilled in the art from a consideration of the preceding description. It is intended that the scope of the invention should be limited only as set forth in the claims which follow.

What is claimed is:

1. A heat sink and spring clip assembly for removing heat from an electronic module and for holding the heat sink and electronic module to a circuit board, comprising:

the heat sink having
a finned top surface, and a flat bottom surface larger than the electronic module for holding the electronic module between the bottom surface and the circuit board, the bottom surface also having a downward extending leg at each corner, each leg ending with a foot for resting on the circuit board and holding the heat sink a fixed distance above the circuit board;

the spring clip for holding the heat sink to the circuit board having a substantially rectangular frame with two opposing torsion bar sides and two opposing leaf spring sides, the sides connected at four corners, and each corner having a downward extending leg with a latching notch for latching into a latching hole in the circuit board when the spring clip is pressed down over the heat sink and the leaf spring sides are compressed.

2. A heat sink and spring clip assembly as in claim 1, further comprising each of two opposing legs of the downward extending legs of the heat sink having a smaller diameter toe extending downward beyond the foot, for extending through an index hole on the circuit board, thereby properly orienting the heat sink in position on the circuit board.

3. A heat sink and spring clip assembly for removing heat from an electronic module and for holding the heat sink and electronic module to a circuit board, comprising:

the heat sink having a finned top surface for dissipating heat into the adjacent air, and a substantially flat bottom surface larger than the electronic module for thermal contact to the electronic module and for holding the electronic module between the bottom surface and the circuit board, the bottom surface also having a downward extending leg at each corner, each leg ending with a foot for resting on the circuit board and holding the heat sink a fixed distance above the circuit board;

the spring clip having a substantially rectangular frame with two opposing torsion bar sides and two opposing leaf spring sides, the sides connected at four corners, and each corner having a downward extending leg with a latching notch for latching into a latching hole in the circuit board, whereby, when the spring clip is pressed down over the heat sink with the electronic module beneath it, the leaf spring sides and circuit board will resiliently compress until the heat sink is stopped at the fixed distance above the circuit board by the foot of each heat sink leg coming to rest on the circuit board, and the spring clip's leaf spring sides will continue to compress until the latching notches are latched into the latching holes in the circuit board, thereby holding the spring clip, heat sink and electronic module to the circuit board.

4. A heat sink and spring clip assembly as in claim 3, further comprising each of two opposing legs of the downward extending legs of the heat sink having a smaller diameter toe extending downward beyond the foot, for extending through an index hole on the circuit board, thereby properly orienting the heat sink in position on the circuit board.

\* \* \* \* \*